United States Patent [19]
Kovacs et al.

[11] Patent Number: 5,490,160
[45] Date of Patent: Feb. 6, 1996

[54] METHOD AND APPARATUS FOR BACK FACET MONITORING OF MULTIPLE SEMICONDUCTOR LASER DIODES

[75] Inventors: Gregory J. Kovacs, Sunnyvale; Donald R. Yingling, Jr., deceased, late of San Francisco, both of Calif., by David Williamson, executor

[73] Assignee: Xerox Corporation, Stamford, Conn.

[21] Appl. No.: 156,226

[22] Filed: Nov. 22, 1993

[51] Int. Cl.$^6$ ........................................ H01S 3/19
[52] U.S. Cl. ......................... 372/50; 372/36; 257/707
[58] Field of Search .......................... 372/50, 97, 107, 372/108, 36, 34; 257/706, 707; 437/902

[56] References Cited

U.S. PATENT DOCUMENTS

| | | | |
|---|---|---|---|
| 3,568,087 | 3/1971 | Phean, Jr. et al. | 372/36 |
| 4,727,554 | 2/1988 | Watanabe | 372/36 |
| 4,818,099 | 4/1989 | Preikschat et al. | 356/5 |
| 4,847,848 | 7/1989 | Inoue et al. | 372/50 |
| 5,016,253 | 5/1991 | Kubota | 372/50 |
| 5,022,035 | 6/1991 | Hasegawa | 372/36 |
| 5,099,488 | 3/1992 | Ahrabi et al. | 372/50 X |
| 5,105,429 | 4/1992 | Mundinger et al. | 372/50 X |
| 5,156,999 | 10/1992 | Lee | 437/902 X |

FOREIGN PATENT DOCUMENTS

| | | | |
|---|---|---|---|
| 2-30783 | 9/1990 | Japan | 372/75 |
| 4-354395 | 12/1992 | Japan | 372/75 |

*Primary Examiner*—Rodney B. Bovernick
*Assistant Examiner*—Hemang Sanghavi

[57] ABSTRACT

The present invention is a novel multiple laser diode structure and method for using such structures to optically isolate the light from the different diodes. The novel structure comprises a submount on which the individual lasing elements are mounted and a back facet monitoring plate coupled to the submount. The back facet monitoring plate comprises a plurality of optically sensitive detectors that monitor the amount of laser light emanating from the back facet. Ideally, one detector should be mounted opposite a back facet for each lasing element. The submount is designed with an isolation bar that optically separates the light from individual lasing elements. The radiation thus detected by each detector emanates from the back facet of a single lasing element. The amount of back facet radiation captured by the detector is proportional to the amount of radiation emanating from the front facet of the lasing element. This information enables the system to individually monitor and subsequently control the spot power of the lasing element in a continuous closed loop fashion.

6 Claims, 8 Drawing Sheets

METHOD AND APPARATUS FOR BACK FACET MONITORING OF MULTIPLE SEMICONDUCTOR LASER DIODES

FIELD OF THE INVENTION

The present invention relates generally to the monitoring of output power of semiconductor laser diodes and particularly to the back facet monitoring of closely spaced, multiple laser diodes.

BACKGROUND OF THE INVENTION

Increasingly, designers of devices that use laser light, such as laser printers and optical memories, have found it advantageous to use arrays of closely spaced laser diodes as their light source. Closely spaced diodes allow for multiple beam processing and thus improve data throughput as compared with older systems that employ continuous wave, single beam gas lasers.

Currently, two array architectures have emerged for use in various applications—monolithic and nonmonolithic laser diode arrays. Typically, monolithic diode arrays are manufactured as an integral array unit. As a result, the diodes comprising the unit usually have the same light characteristics, such as wavelength and polarization.

By contrast, nonmonolithic arrays usually comprise a plurality of individual laser diodes mounted on a support. Individually manufactured diodes offer the advantage of variable beam characteristics. For example, each diode in the array may lase at a different wavelength or polarization. This variation is desirable in the context of color laser printing, as discussed in U.S. Pat. No. 5,243,359 issued to Tibor Fisli on Sep. 7, 1992, entitled "A Raster Output Scanner for a Multistation Xerographic Printing System."

Typically, the lasing elements in both monolithic and nonmonolithic laser arrays are individually addressable. Individual addressability generally requires that each lasing element have a separate current source that drives or modulates the lasing element. In operation, each driver sends a current through the diode sufficient to induce emission of laser light. The amount of current the driver produces is determined, in part, by the digital data driving that particular lasing element.

However, because different laser diodes have different output power characteristics in response to a given driving current, it is desirable to monitor the amount of output power from each laser diode. If it is found that a particular diode is outputting too much or too little power at a given current level then the current needs to be adjusted to correct for the power differential.

Diodes are typically constructed layer by layer from epitaxial deposition of appropriately doped semiconductor material. The front and back facets are then cleaved to produce reflective surfaces that define the front and back boundaries of the laser cavity. The front facet is designed to be more transmissive than the back facet which is designed to be more reflective. In that way, the front facet is the side from which the majority of laser light is emitted.

As stated above, the back facet is designed to be a highly reflective surface. However, some light ultimately escapes through the back facet of the diode. The amount of light leakage through the back facet is generally known to be proportional to the amount of light emitted from the front facet. This relationship between radiation from the back facet and the radiation from the front facet affords the opportunity to monitor the amount of output power from the front facet.

To measure the amount of light from the back facet of an array of diodes, a detector is typically disposed opposite the back facet of a single laser diode. In the case of a single laser diode configuration, one back facet detector gives complete information concerning the amount of radiation emanating from the front facet of that diode. In a multi-diode configuration, the confluence of concurrent, multiple beams does not give information concerning any particular diode.

FIG. 1 depicts a known laser diode array design 10. Laser diodes 20 are disposed on support 25 so as to maintain close spacing of their output beams 30 from their respective front faces. While the majority of the laser light escapes from the front facet, some radiation 35 leaks from the back facet of the diode.

As can be seen from FIG. 1, the light from both the front and the back facet spread out in a conic shape and overlap at some distance from the facets. Thus, the radiated beams emanating from the back facets of the closely spaced diodes are difficult to distinguish. This problem becomes more acute as the diodes are spaced closer together.

Separating and detecting light from individual diodes is important from the standpoint of monitoring and ultimately controlling the output power from individual diodes. With arrays of closely spaced laser diodes, this is generally not possible with a single back facet detector.

The problem with a single back facet detector opposite the entire set of diodes is that no discernible information concerning the output power of any one laser diode is available when two or more beams are concurrently impinging upon the detector. Without information concerning individual diodes, it is not possible to correct for individual variations in output.

Thus, there is a need to construct an array architecture such that the amount of light emitted from individual back facets is detected. Additionally, there is a need to regulate the output of the individual diodes in a continuous closed loop fashion, given this information concerning output power. This regulation is needed to insure high print quality.

It is thus an object of the present invention to provide an array architecture such that the amount of output power from individual back facets of laser diodes can be individually monitored in a continuous fashion.

SUMMARY OF THE INVENTION

In summary, the present invention is a novel multiple laser diode structure and method for using such structures to optically isolate the light from the different diodes. The novel structure comprises a submount on which the individual lasing elements are mounted and a back facet monitoring plate coupled to the submount. The back facet monitoring plate comprises a plurality of optically sensitive detectors that monitor the amount of laser light emanating from the back facet. Ideally, one detector should be mounted opposite a back facet for each lasing element.

The submount is designed so that the individual lasing elements are optically isolated. The radiation thus detected by each detector emanates from the back facet of a single lasing element. The amount of back facet radiation captured by the detector is proportional to the amount of radiation emanating from the front facet of the lasing element. This information enables the system to individually monitor and subsequently control the spot power of the lasing element in a continuous closed loop fashion.

One advantage of the present invention is the ability to continuously control the spot power of a single lasing element. Both the user and the system require that the power of imaging spots impinging on the photoreceptor surface be accurately controlled. Information gleaned from monitoring spot power can be used to accurately control the power output.

Another advantage of the present invention is ease of manufacture. The submount used to mount the individual diodes can also be used to optically separate the back facet radiation.

Yet another advantage of the present invention is compatibility. The design of the present invention is compatible with the method of constructing existing commercial mounting packages for laser diodes.

Additional objects and features of the present invention will be more readily apparent from the following detailed description of an exemplary embodiment thereof, as illustrated in the accompanying drawings.

BRIEF DESCRIPTION OF THE DRAWINGS

The purpose and advantages of the present invention will be apparent to those skilled in the art from the following detailed description in conjunction with the drawings.

DETAILED DESCRIPTION OF THE PREFERRED EMBODIMENTS

The following description is presented to enable any person skilled in the art to make and use the invention, and is provided in the context of a particular application and its requirements. Various modifications to the preferred embodiments will be readily apparent to those skilled in the art, and the generic principles defined herein may be applied to other embodiments and applications without departing from the spirit and scope of the present invention as defined by the appended claims. Thus, the present invention is not intended to be limited to the embodiments shown, but is to be accorded the widest scope consistent with the principles and features disclosed herein.

Figure 1:
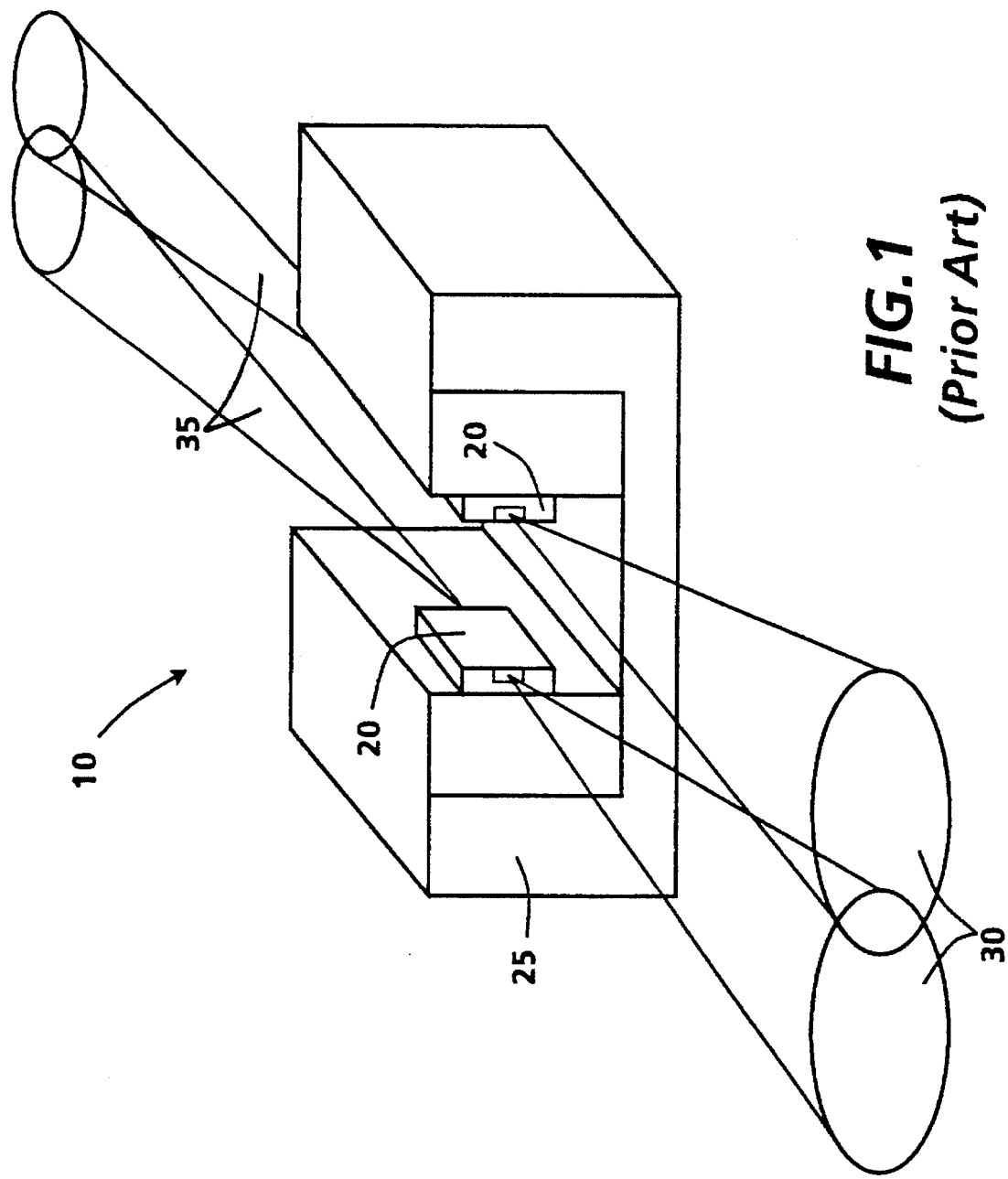
FIG. 1 depicts a typical array design of closely spaced laser diodes.
Figure 2:
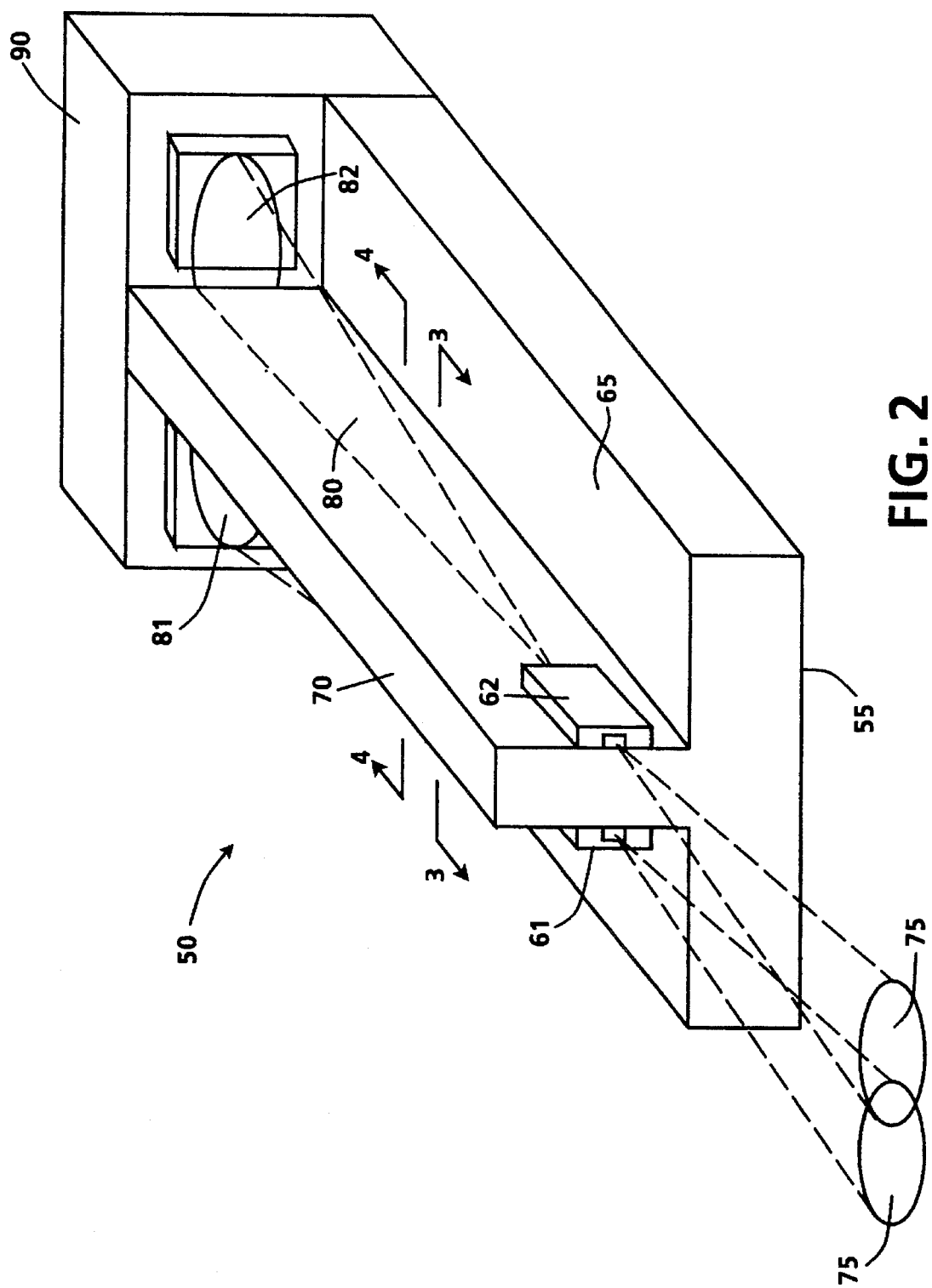
FIG. 2 depicts a first embodiment of the present invention. A perspective view of an array of two laser diodes is shown with a back facet detector plate made in accordance with the principles of the present invention.

Referring to FIG. 2, a first embodiment of the present invention having two laser diodes is shown. An array 50 comprised of two laser diodes 61 and 62 with a back facet detector plate 90 made in accordance with the principles of the present invention is shown in perspective view. Presently preferred array 50 comprises two lasing elements 61, 62 disposed on submount 55. Submount 55 further comprises a base portion 65 and a T-shaped isolation bar 70 that is disposed outward from the base.

The lasing elements 61 and 62 are positioned on either side of the T-shaped isolation bar 70. The isolation bar 70 is composed of an optically opaque material so as to optically separate the individual lasing elements.

The isolation bar 70 is also designed to thermally separate the individual lasing elements. Thus, the bar is composed of a material that is thermally conductive. The isolation bar 70 conducts the heat generated by lasing elements 61 and 62 to the comparatively large base 65 which acts as a heat sink. The composition and structure of submount unit is described in greater detail in commonly assigned and cross referenced U.S. patent application No. 08/156,227, entitled "Nonmonolithic Arrays of Accurately Positioned Diode Lasers", filed on Nov. 22, 1993 by Biegelsen et al., which is herein incorporated by reference.

In the preferred embodiment, the material should be such that the bar can be machined or constructed to a thickness of 100 μm±2 μm. For the proper electrical and thermal contact with the lasing elements, the side walls of the isolation bar should ideally be smooth to within ±1 μm. It will be appreciated that the above described dimensions and alignments for different configurations is provided to aid one skilled in the art to practice the present invention and that the present invention should not be limited to these dimensions. Indeed, the present invention encompasses any design in which the back facet radiation of the individual lasing elements are isolated and separately monitored.

As depicted in FIG. 2, lasing elements 61 and 62 emit radiation 75 out of their respective front facets. These beams travel down the main optical path of the device (e.g laser printer, optical memory, etc.—not shown) to do the effective work of the device. As discussed above, some radiation leakage occurs out the back facet of the lasing elements. These beams 80 travel in opposite direction to the front facet beam.

The present invention isolates and detects the back facet radiation from each lasing element. As can be seen in FIG. 2, a back facet plate 90 is affixed to the rear portion of the submount 55. Back facet detectors 81 and 82 are disposed on the plate so that when the plate is affixed to the submount, the detectors are on opposite sides of the isolation bar 70 and positioned to receive the back facet radiation of the lasing elements.

Figure 3:
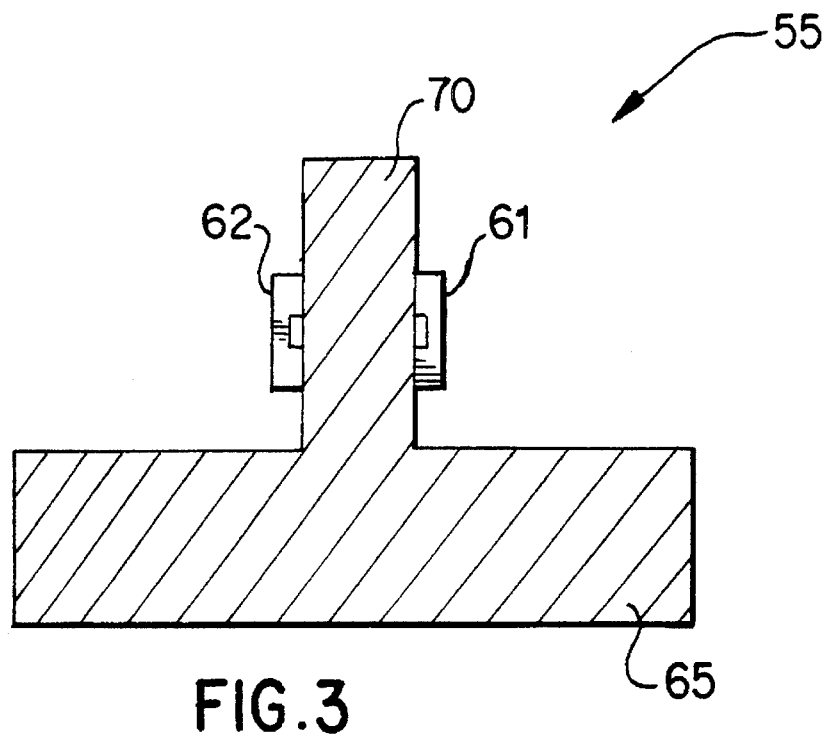
FIG. 3 is a cross sectional view of the embodiment given in FIG. 2, as viewed from reference arrow A.
Figure 4:
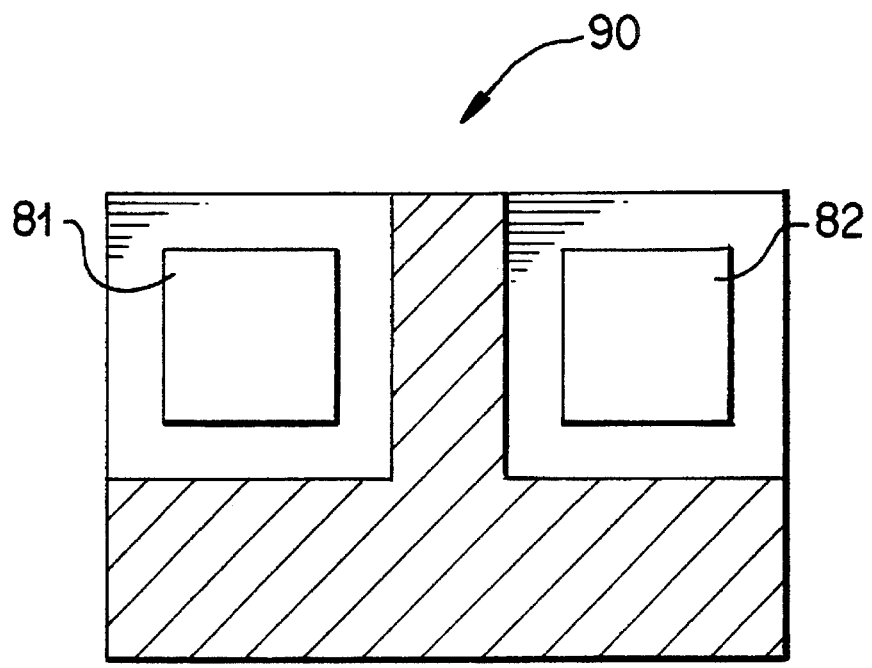
FIG. 4 is a cross sectional view of the embodiment given in FIG. 2, as viewed from reference arrow B.

Having discussed the structure of a first preferred embodiment, the preferred method of manufacturing the structure will now be discussed. FIGS. 3 and 4 show the structure of FIG. 2 as two basic subassemblies: the submount and the back facet detector plate, respectively. FIG. 3 is a cross sectional view of the submount as viewed from reference arrow A. FIG. 4 is a view of the back facet detector as viewed from reference arrow B.

Presently, the submount 55 is made from highly conductive silicon and is cut to specification using a precision automatic diamond cutting and milling saw. The back facet plate 90 is also made of highly conductive silicon and similarly cut to specification. The back facet detectors 81 and 82 are mounted on the plate or, alternatively, can be prefabricated on the silicon plate.

The back facet plate with detectors is then attached to the end of the submount with a conductive epoxy. Extending the submount and the isolation bar to the back facet detectors allows monitoring of the individual laser diodes and eliminates light from all but one diode from directly reaching any given detector. It will be appreciated that although the submount base and the isolation bar are integrally formed in the presently preferred embodiment, it is possible for one skilled in the art to connect a separate isolation bar to the base.

Figure 5:
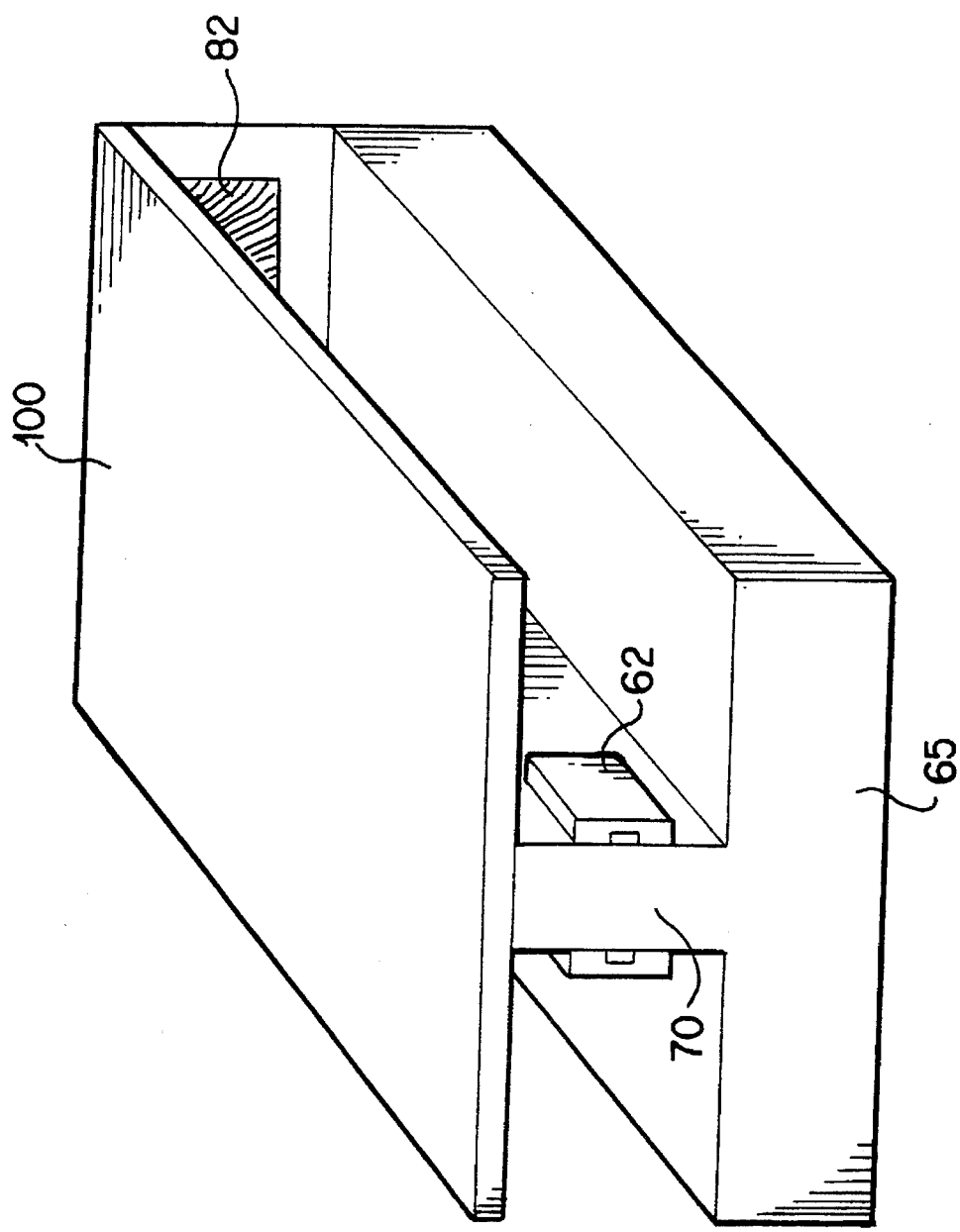
FIG. 5 is an alternative embodiment for isolating two laser diodes. A plate is disposed on top of the submount assembly to prevent other stray light from impinging on the back facet detector.

When a laser diode array is assembled into a mounting package, there is a small possibility that unwanted stray light might reach a back facet detector. To avoid such a possibility, additional plates may be disposed on the open sides of the diode to effectively box in the diode. FIG. 5 is a perspective view of the array configuration of FIG. 2 with a top plate 100. It will be appreciated that it is well known for those skilled in the art to provide side plates in addition to the top plate 100 for the structure shown in FIG. 5.

Figure 6:
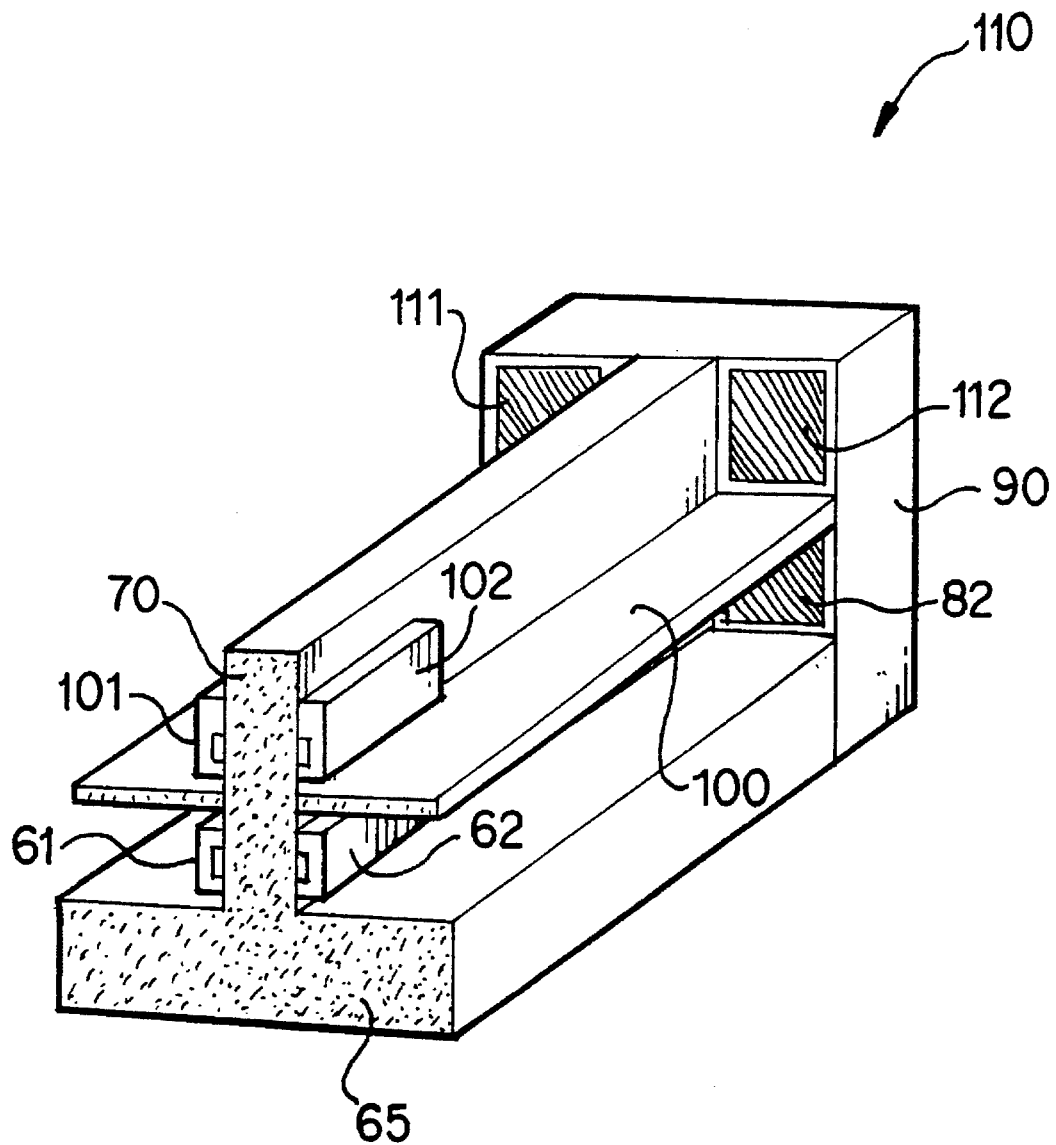
FIG. 6 is a second embodiment of the present invention. A quad-pack of laser diodes is shown with isolation bars disposed to separate the light from the four laser diodes.

Another preferred embodiment of the present invention concerns the optical isolation of a quad array of laser diodes. FIG. 6 depicts such an array 110 of four laser diodes. As can be seen, to isolate the upper diodes 101 and 102 from the lower ones 61 and 62, top plate 100 is disposed between the pair of diodes. Additionally, bar 70 is extended high enough to provide isolation of diodes 101 and 102. The back facet detector plate 90 is similarly extended to include two additional detectors 111 and 112. Detectors 111 and 112 are disposed opposite the back facets of diodes 101 and 102 to measure and monitor the radiation from the back facets of the respective diodes.

It will be appreciated that although FIG. 6 shows only four laser diodes disposed together in an array, it is possible for one skilled in the art to make arrays of any size and number of diodes by extending the basic structure. As a special case, it is possible for one skilled in the art to produce linear structures with isolation bars. Accordingly, the present invention should not be limited to the particular embodiments disclosed herein.

It will also be appreciated that although FIGS. 2 and 5 show the diodes mounted on the isolation bar in the preferred embodiment, the present invention also encompasses any arrangement where the diodes are mounted on other parts of the submount. For example, the laser diodes could be mounted on the base of the submount as opposed to the isolation bar for the purposes of the present invention. In fact, the present invention encompasses all mounting arrangements in which there is an isolation bar or plate to optically isolate adjacent diodes.

Figure 7:
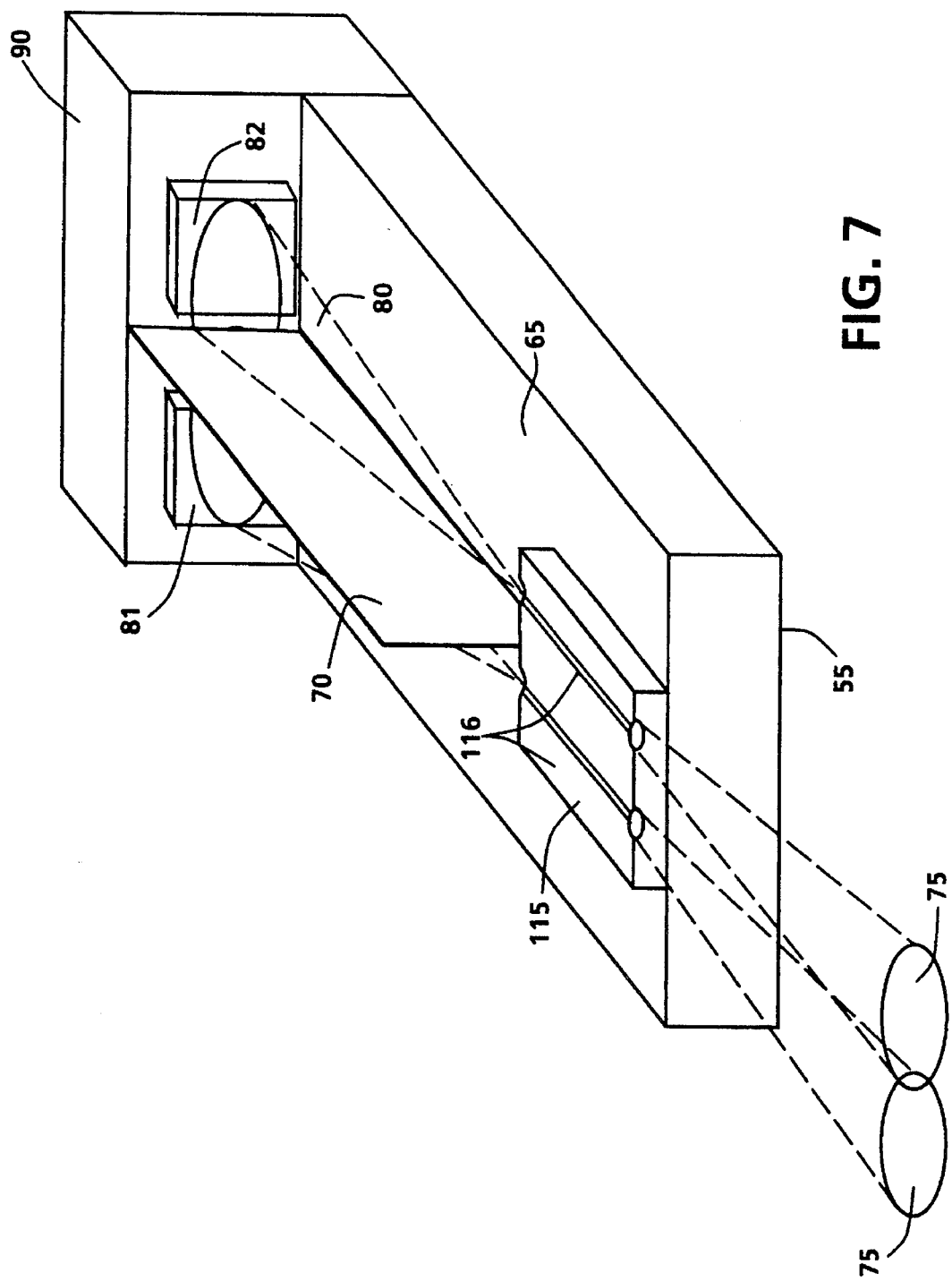
FIG. 7 is a third embodiment of the present invention. A monolithic laser diode array is mounted on a base and an isolation bar is disposed on the base so that the bar optically separates the back facet radiation from the adjacent laser stripes.

Yet another preferred embodiment involves the isolation of back facet radiation from adjacent laser stripes in a monolithic array structure. FIG. 7 depicts a monolithic array 115 mounted on a base 65. As can be seen, laser stripes 116 run the length of the array and laser light radiates out both the front facet (as shown as beams 75) and the back facet (as shown as beams 80) at the end of the stripes.

Isolation bar 70 is disposed at the end of the array 115 in such a manner as to separate the beams emanating from the back facet of the array. The radiation from these stripes find their way down the length of the submount and impinge on individual back facet monitors 81 and 82. It will be appreciated that other mounting arrangements for monolithic arrays are possible and that the present invention should not be limited accordingly.

The present invention encompasses any mounting arrangement whereby an isolation bar is disposed between adjacent stripes.

Figure 8:
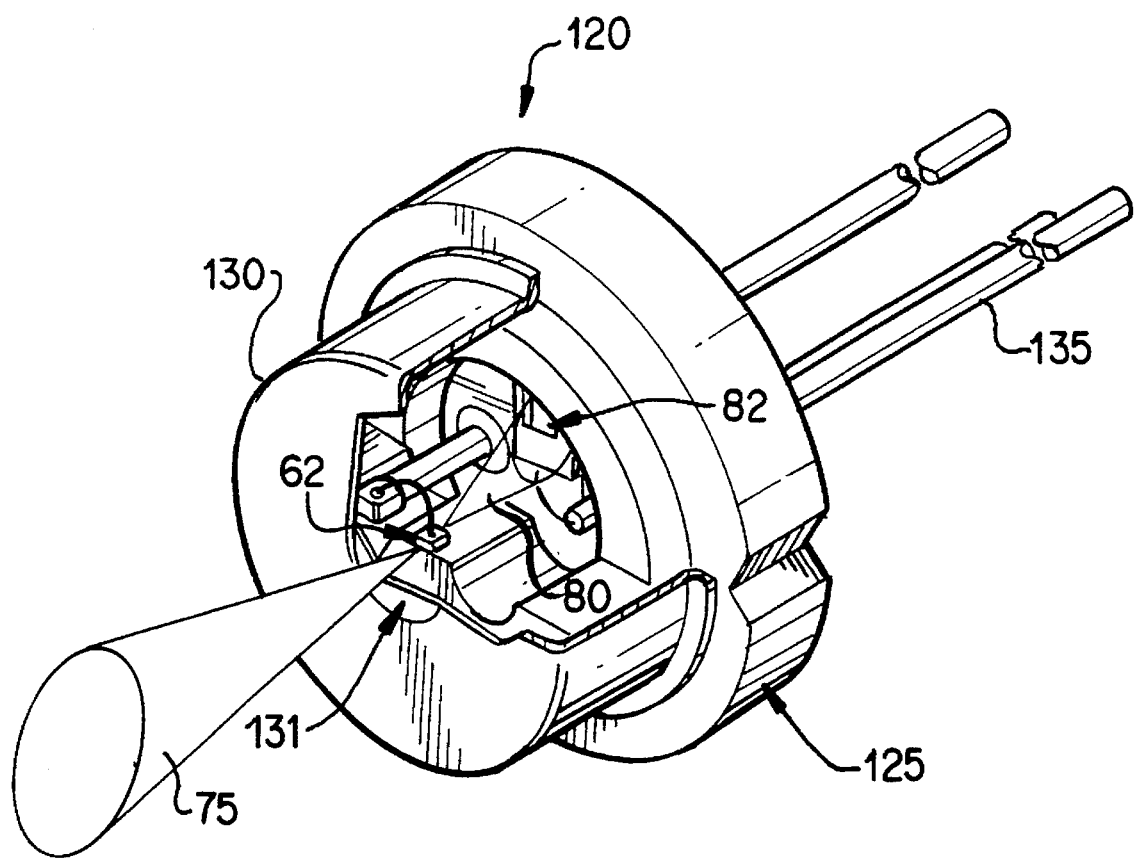
FIG. 8 is a cut-away, perspective view of the commercial mounting package having a single laser diode and back facet detector disposed inside.

Now it will be discussed how the present invention fits into existing commercial mounting packages. FIG. 8 is a cut-away, perspective view of such a commercial mounting package 120. Package 120 typically comprises mounting base 125, housing 130, window 131, and leads 135. Lasing element 62 is mounted inside housing 130 such that radiation 75 emanating from its front facet can pass through window 131 and radiation 80 emanating from its back facet is projected onto a back facet detector 82. Leads 135 provide electrical connection to outside electronics. FIG. 8 shows that the typical mounting package has three such leads—one to drive the lasing element 62, one for the back facet detector 82, and the third for common ground.

Figure 9:
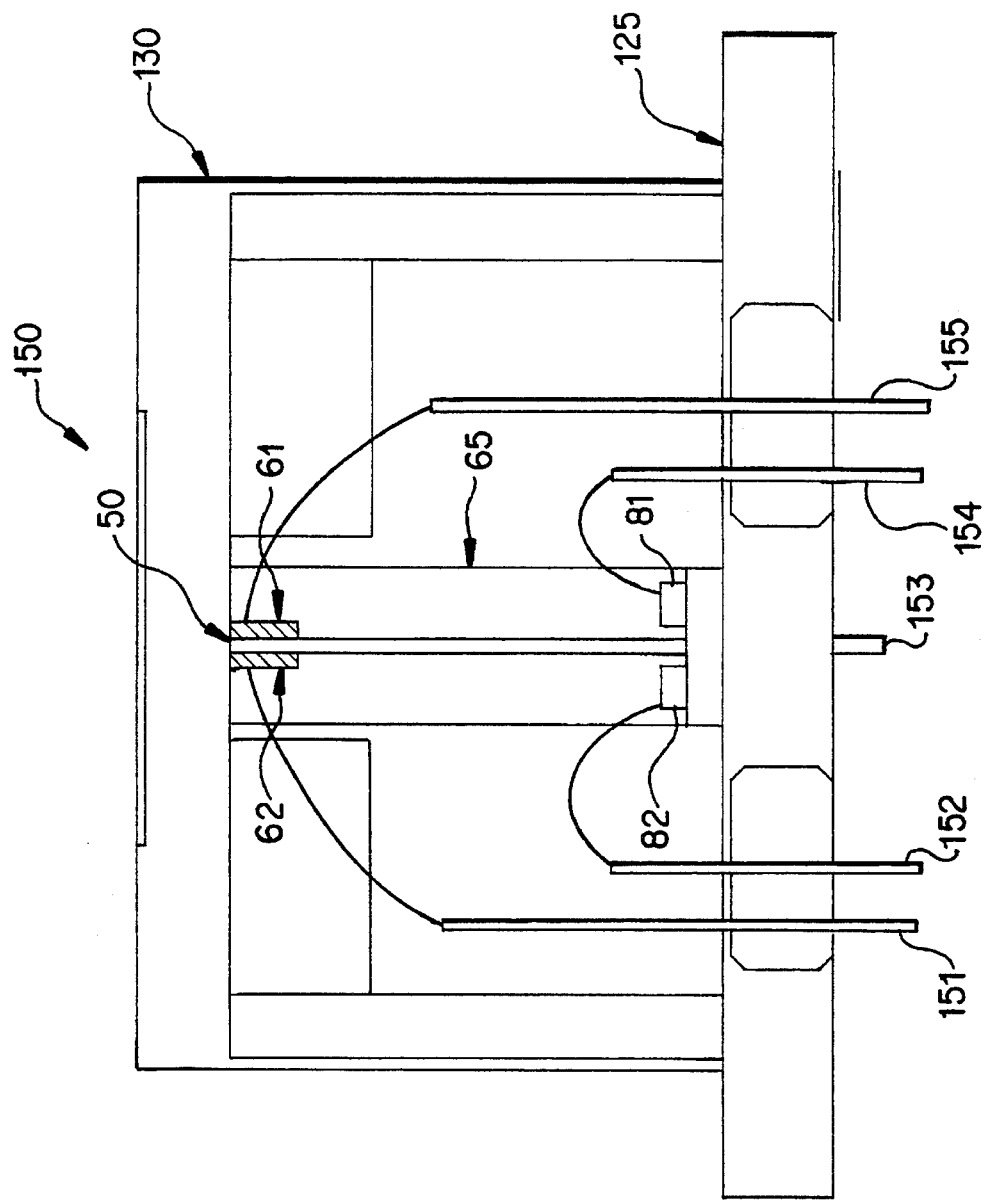
FIG. 9 is a cross sectional, side view of the present invention that is mounted in a presently preferred package. The package provides the present invention with electrical connections to outside electronics.

FIG. 9 is a cross sectional, side view of the present invention mounted in a presently preferred package 150. The major difference between the presently preferred package and the existing commercial package is the number of leads. In a dual laser diode array such as depicted in FIG. 9, five leads are provided to give electrical connection. Leads 151 and 155 provide the driving current for lasing elements 62 and 61 respectively. Leads 152 and 154 provide connection for back facet detectors 82 and 81 respectively. Lead 153 provides a common ground for the entire package and is connected to submount 65. It will be appreciated that it is possible for one skilled in the art to construct similar mounting packages for array structures other than dual diode arrays.

In summary, the present invention is a novel laser diode array structure and method for monitoring back facet radiation from individual laser diodes. The present invention uses an optically opaque bar or shield to isolate the individual detectors in such a manner that the detectors monitor the radiation from only one diode. This individual monitoring allows for the continuous closed loop control of individual laser diodes. This is particularly useful in the area of multiple spot laser printing or the like where the diode sources are meant to be independently addressable.

What is claimed:

1. In an array of laser diodes having front and back facets, an apparatus for monitoring the back facet radiation of a plurality of individual laser diodes, said apparatus comprising:

a unitary submount on which the plurality of laser diodes is disposed, said submount comprising a base section and a bar section, said base section and bar section consisting entirely of a thermally and electrically conductive material to optically and thermally separate said individual laser diodes from each other, and said bar section integrally formed on and disposed outwardly from said base section, with individual laser diodes disposed on said submount and separated by said bar section, to isolate light emitted from adjacent laser diodes;

a back facet plate disposed on the submount opposite the back facets of the array of laser diodes; and back facet detectors mounted on the back facet plate such that the light falling on a given detector is from one of the laser diodes.

2. The apparatus as recited in claim 1 wherein the laser diodes are disposed on said base section.

3. The apparatus as recited in claim 1 wherein the laser diodes are disposed on said bar section.

4. The apparatus as recited in claim 1 wherein the array of diodes is a monolithic array.

5. The apparatus as recited in claim 1 wherein the array of diodes is a nonmonolithic array.

6. In an array of laser diodes having a unitary submount on which the diodes are disposed, each diode having a front facet and a back facet, a method for constructing said array of laser diodes having back facet monitoring of individual light beams emitted from individual laser diodes, the step of said method comprising:

A) providing the unitary submourn comprising a bar section integrally formed on a base section consisting entirely of a thermally and an electrically conductive material to optically and thermally separate said individual laser diodes from each other;

B) disposing the bar section outwardly from the base section;

C) disposing the individual laser diodes on the unitary submount separated by the bar section such that the light beam from each diode is segregated;

D) disposing a back facet plate on the unitary submount opposite the back facets of the array of laser diodes; and E) disposing a back facet detector on the back facet plate opposite each back facet of the diodes such that the radiation detected by the detector is the light beam from a single diode segregated by the bar section.

* * * * *